United States Patent [19]
Söderström et al.

[11] Patent Number: 5,113,231
[45] Date of Patent: May 12, 1992

[54] QUANTUM-EFFECT SEMICONDUCTOR DEVICES

[75] Inventors: Jan R. Söderström; Thomas C. McGill, both of Pasadena, Calif.

[73] Assignee: California Institute of Technology, Pasadena, Calif.

[21] Appl. No.: 404,148

[22] Filed: Sep. 7, 1989

[51] Int. Cl.$^5$ .......................................... H01L 29/205
[52] U.S. Cl. ......................................... 357/16; 357/4; 357/22; 357/34
[58] Field of Search .................... 357/16, 4, 22, 34

[56] References Cited

U.S. PATENT DOCUMENTS

| | | | |
|---|---|---|---|
| 4,137,542 | 1/1979 | Chang et al. | 357/16 |
| 4,326,208 | 4/1982 | Fang et al. | 357/16 |
| 4,538,165 | 8/1985 | Chang et al. | 357/16 |
| 4,849,799 | 7/1989 | Capasso et al. | 357/34 |

FOREIGN PATENT DOCUMENTS

63-174367  7/1988  Japan ..................... 357/34

OTHER PUBLICATIONS

Chang et al., *IBM TDB*, vol. 22 No. 7 Dec. 79 "GaSb-InAs-GaSb pnp . . . Speeds".
*IBM TDB*, vol. 31 No. 7 Dec. 1988 "Negative Resistance Device".

*Primary Examiner*—Jerome Jackson, Jr.
*Attorney, Agent, or Firm*—Leonard Tachner

[57] ABSTRACT

A novel combination of semiconductor heterojunctions provide a quantum-effect device with resonant or enhanced transmission of electrons (or holes) due to tunneling into a quantum well state in the valence (or conduction) band. A particular heterostructure comprising sequentially grown layers of indium arsenide, aluminum antimonide, gallium antimonide, aluminum antimonide and indium arsenide, permits electrons tunneling from the indium arsenide conduction band through the aluminum antimonide barrier into a sub-band level in the valence band quantum well of the gallium antimonide. This particular embodiment produced a current-voltage characteristic with negative differential resistance and a peak-to-valley current ratio of about 20 at room temperature and 88 at liquid nitrogen temperature. The present invention can be used either as a two-contact device such as a diode or a three-contact device such as a transistor.

21 Claims, 10 Drawing Sheets

QUANTUM-EFFECT SEMICONDUCTOR DEVICES

ORIGIN OF INVENTION

This invention was made with Government support under Grant No. N00014-89-J-1141 awarded by the Department of the Navy. The Government has certain rights in this invention.

TECHNICAL FIELD

The present invention relates generally to quantum-effect semiconductor devices and more specifically, to improved quantum-effect semiconductor devices with negative differential resistance in which resonant interband tunneling in a novel heterostructure is used to provide higher peak-to-valley current ratios.

BACKGROUND ART

The electronics industry and integrated circuits seem to be inversely related. The industry grows as circuits shrink and growth continues as long as more and more circuits can be integrated into a single chip. The motive for shrinking the components of integrated circuits is minimizing the cost and time needed to perform each circuit function. Most functions are carried out by transistors which act essentially as switches. In a transistor, the speed and precision with which switching can be controlled, as well as the power needed to produce the switching, is directly related to the time and cost per function attained by the device. Because of its size, a transistor switch that operates on the principles of quantum mechanics would be faster and would consume less power than a conventional transistor. Furthermore, because of the effects peculiar to quantum phenomena, it could also afford a greater degree of control.

Because the way in which quantum semiconductor devices function is qualitatively different, quantum-effect devices promise more precise and efficient control of switching in a size regime ordinary transistors and other semiconductors devices could never approach. This difference is manifested for example in the current-voltage characteristics. In particular, some quantum semiconductor devices exhibit negative differential resistance: that is, there is a voltage range in which the current decreases as the applied voltage increases. On a graph of current versus voltage, this property translates into a current peak and a current valley. The presence of negative differential resistance is often the only indication a physicist has that quantum-effects are operative in an experimental device.

The elusive phenomenon at the heart of quantum-effects is the wave nature of electrons. Quantum theory predicts that an electron will exhibit wave-like behavior whenever the region within which it is confined, or the barriers erected to contain it, has dimensions approaching the electron's wavelength.

Hence, at least one dimension of a quantum device is comparable to the wavelength of an electron. By way of example, in gallium arsenide at room temperature that wavelength measures about 200 Angstrom units or 20 billionths of a meter.

The barriers that can contain electrons are barriers of energy rather than physical barriers. All electrons possess a finite amount of energy and are said to occupy energy levels; the levels available are characteristic of a given material. A group of closely spaced levels is called a band. In most solids the energy levels in each band are so closely spaced that they are essentially continuous and thus an electron can change levels with only an infinitesimal boost of energy.

The relative positions of energy bands determine whether current can be conducted across an interface of two different materials. For an electron to pass from one material to another without change of energy, the bands of the two materials must overlap. Specifically, in the first material the average level occupied by electrons, called the Fermi level, must coincide with an energy band of the second material. If the energy band of the second material occurs at a much higher energy level than the Fermi level of the first, the second material acts as a barrier to electron movement.

For example, under ordinary circumstances, aluminum gallium arsenide (AlGaAs) presents a barrier to the electrons in n-doped gallium arsenide. An electron cannot pass from the doped gallium arsenide (GaAs) to aluminum gallium arsenide because the conduction band of aluminum gallium arsenide is at a much higher energy level than the Fermi level of the gallium arsenide. Yet, if the physical dimensions of the barrier are altered in such a way that the wave nature of electrons comes into play, an electron can "tunnel" through the aluminum gallium arsenide that was once an obstacle. Hence, when a layer of aluminum gallium arsenide thinner than 200 Angstroms is sandwiched between two pieces of doped gallium arsenide, the electrons can tunnel through it to the gallium arsenide on the other side. This tunneling is one kind of quantum-effect. When barriers confine electrons within a space comparable to an electron wavelength, the electrons are subject to other quantum-effects.

Resonance is one of the other such quantum-effects and occurs only when some degree of size quantization has been achieved. Electron waves, at a given energy, that enter for example, a quantum well, which is a one-dimensional restriction, are reflected off the far wall of the well; the waves essentially bounce back and forth within the quantum chamber. In doing so they increase the tunneling current substantially, i.e., they resonate. Both size quantization and resonance result from the constructive interference of the forward and backward waves. It is difficult to separate the current enhancement that can be attributed to resonance from the enhancement that results from other quantum-effects such as increased density of states at a given energy level. However, as it happens, that distinction is not crucial for device operation. What does matter is that in a quantum-effect device two slightly different voltages can evoke profoundly different responses. For example, the current-voltage characteristics of a quantum well device reflect the quantization of energy states in the gallium arsenide well. Such devices show a range of voltages in which the current conducted by the device decreases as the voltage applied to one of the n-doped gallium arsenide contacts increases. This happens because at one voltage (the resonant voltage) the average energy of electrons in the n-doped substance shifts to a level that coincides with one of the quantum states in the well, but beyond that voltage the energy band of the doped gallium arsenide occurs between quantum states. Hence, at the resonant voltage an electron can tunnel through the aluminum gallium arsenide energy barrier into the well, whereas at the valley voltage, there are no states for the electron to tunnel into and consequently, the current dips dramatically.

Semiconductor tunnel structures with negative differential resistance (NDR) have been extensively studied for years. The reason for this interest are applications such as microwave and fast digital devices. The tunnel diode (the ESAKI DIODE), in which carriers tunnel across the band gap of a forward biased pn-junction, was invented in 1958. In 1974 the double barrier resonant tunneling diode was first demonstrated. In this structure NDR arises from electrons tunneling through a quantum well state. Recently, the single barrier tunneling diode was introduced as another NDR device. Electrons tunnel through this structure at energies close to the valence band of the barrier layer yielding a decrease in transmission probability as the voltage increases.

For many applications, NDR devices must have a large peak current density and a low valley current density. Hence, the peak-to-valley current ratio is used as a figure of merit. The ESAKI diode has produced peak-to-valley current ratios larger than 50. Aluminum gallium arsenide/gallium arsenide double barrier resonant tunneling diodes have been observed to display a peak-to-valley current ratio of 3.9 at room temperature and 21 at 77 degrees Kelvin, the temperature of liquid nitrogen. Similarly, indium gallium arsenide/aluminum arsenide structures have yielded peak-to-valley current ratios of 14 at room temperature and 35 at the temperature of liquid nitrogen. The single barrier tunneling diode structure of indium arsenide/aluminum gallium antimonide has thus far produced peak-to-valley current ratios of 1.6 at room temperature and 3.4 at the temperature of liquid nitrogen. The higher is the peak-to-valley current ratio of a quantum-effect semiconductor device, the more useful its applications may be such as in the form of diodes and transistors. By way of example, an extremely high peak-to-valley current ratio for use in a diode, would find highly advantageous application to microwave oscillators, mixers and detectors as well as switching applications and high speed digital and analog circuits. Devices which employ extremely high peak-to-valley current ratios in transistor form find advantageous application in microwave amplifiers and also in digital and analog high speed circuits.

SUMMARY OF THE INVENTION

The present invention comprises a new tunnel structure with characteristics that out-perform previous tunnel structures. The present invention comprises a resonant interband tunneling semiconductor device in which electrons (or holes) tunnel from the conduction (valence) band of the contact or cladding layer through a barrier and into a quantized hole (electron) state in the valence (conduction) band of the quantum well layer. Both diode and transistor configurations are discussed. An exemplary diode embodiment of the resonant interband tunneling device of the present invention comprises a heterostructure having sequential epitaxially grown layers of indium arsenide, aluminum antimonide, gallium antimonide, aluminum antimonide and indium arsenide. Various samples of this material all display strong NDR with peak-to-valley current ratios as high as 20 at room temperature and 88 at the temperature of liquid nitrogen. These are believed to be the highest values of peak-to-valley current ratios reported so far for any tunnel structure.

Two transistor embodiments of the present invention are also disclosed herein. These embodiments of transistor configurations both comprise the same heterostructure of the above described diode configuration. In one such configuration, the gallium antimonide layer serves as the base or gate electrode of the transistor and the indium arsenide layers serve as the emitter and collector or source and drain, respectively. In a second transistor configuration one of the indium arsenide layers serves as the gate or base of the transistor and the other indium arsenide layer serves as the source or emitter while the gallium antimonide layer serves as the drain or collector.

The present invention in more generic terms and not necessarily limited to the specific materials disclosed herein, comprises a tunneling semiconductor device having adjacent layers of selected materials for generating adjacent energy bands wherein at least a first selected voltage bias produces a valence electron energy level of the quantum well layer which is higher than the conduction electron energy level of the adjacent layers and wherein at a second selected voltage bias the opposite holds, that is, the valence level or band edge of the quantum well layer falls below the adjacent conduction levels thereby establishing a barrier to tunneling. In devices in which the carriers are holes, as opposed to electrons, the selected layer materials would provide contact layer valence band energy levels that are higher than the conduction band of the quantum well layer at peak current.

OBJECTS OF THE INVENTION

It is therefore a principal object of the present invention to provide improved quantum-effect semiconductor devices in which resonant interband tunneling in a novel heterostructure provides higher NDR peak-to-valley current ratios than has been previously attainable in tunneling structures.

It is an additional object of the present invention to provide an electron tunneling semiconductor device having materials for generating adjacent energy bands wherein at a first selected voltage bias the valence band edge of the quantum well layer is higher than the conduction level of adjacent layers and at a second selected voltage bias the opposite holds so that a rigid barrier to current is created.

It is still an additional object of the present invention to provide a novel negative differential resistance device based upon a resonant interband tunneling heterostructure, one embodiment of which comprises sequentially grown layers of indium arsenide, aluminum antimonide, gallium antimonide, aluminum antimonide and indium arsenide in which electrons tunnel from the indium arsenide conduction band into a quantized state in the gallium antimonide valence band giving rise to a peak in the current-voltage characteristic.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

DETAILED DESCRIPTION OF PREFERRED EMBODIMENTS

Figure 1:
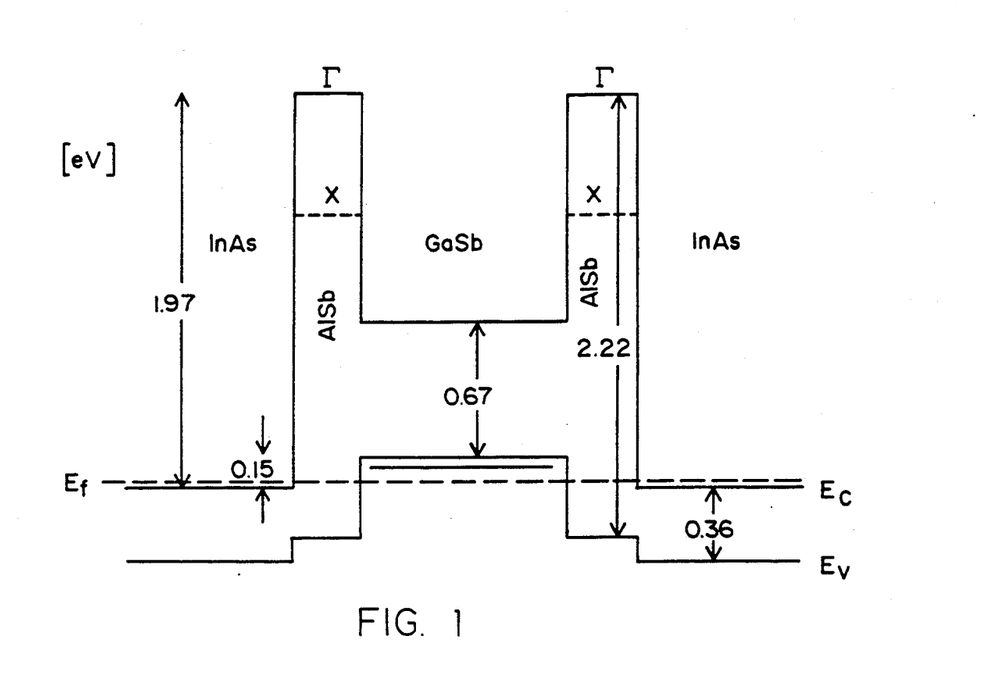
FIG. 1 is an energy band diagram of a novel heterostructure of the present invention shown at zero voltage bias.

Turning first to FIG. 1 which is a schematic diagram of the valence and conduction band edges of a heterostructure of the present invention, it will be seen that this band diagram represents a new tunnel structure with characteristics that out-perform previous tunnel structures. More specifically, FIG. 1 represents the energy band relationships of a resonant interband tunneling diode in which electrons tunnel from the conduction band of the contact layer through a barrier and into a quantized hole state in the valence band of the quantum well layer. This structure can be considered to be a combination of the ESAKI diode and the double barrier resonant tunneling diode with the individual advantages (i.e., the high peak-to-valley current ratio of the former and the high frequency properties of the latter) combined in one device. The resonant interband tunneling diode embodiment, illustrated in band energy format in FIG. 1, comprises the heterostructure of indium arsenide, aluminum antimonide, gallium antimonide, aluminum antimonide and indium arsenide. An important feature of this heterostructure is that the valence band edge of the gallium antimonide layer is higher in energy than the conduction band edge of the indium arsenide contact layers allowing electrons to tunnel through the valence band quantum well. As in the case of double barrier resonant tunneling structures, the tunneling electrons have a peaked transmission probability at the energy of quantized state in the well. This process is normally called "resonant tunneling" and does not distinguish between coherent and non-coherent tunneling of electrons. The electron wave function in indium arsenide couples primarily to the light hole state in the well. Coupling to the heavy holes is expected to be much weaker because in a homogeneous bulk crystal such coupling would be forbidden by symmetry. For the present it is assumed that the electrons tunnel through the quantized light hole state in the well.

Figure 2:
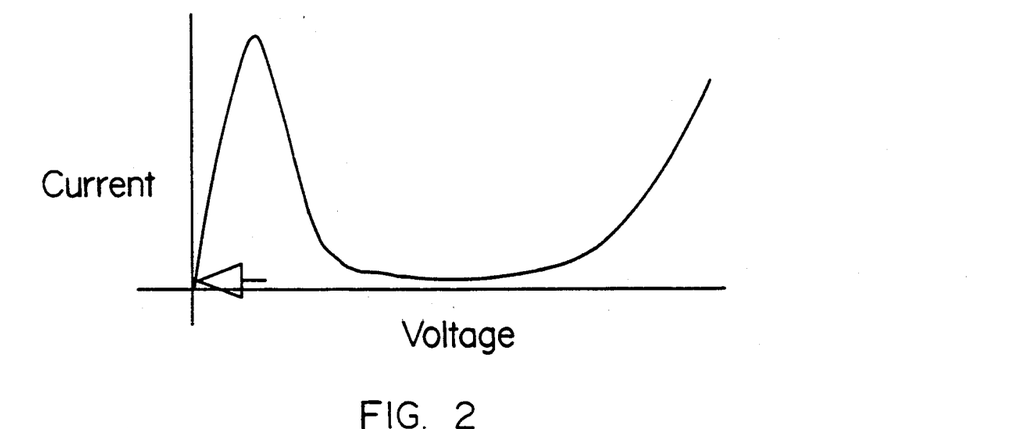
FIG. 2 is a graphical illustration of the current-voltage characteristic of the heterostructure of FIG. 1 illustrating the point corresponding to the band diagram of FIG. 1.
Figure 3:
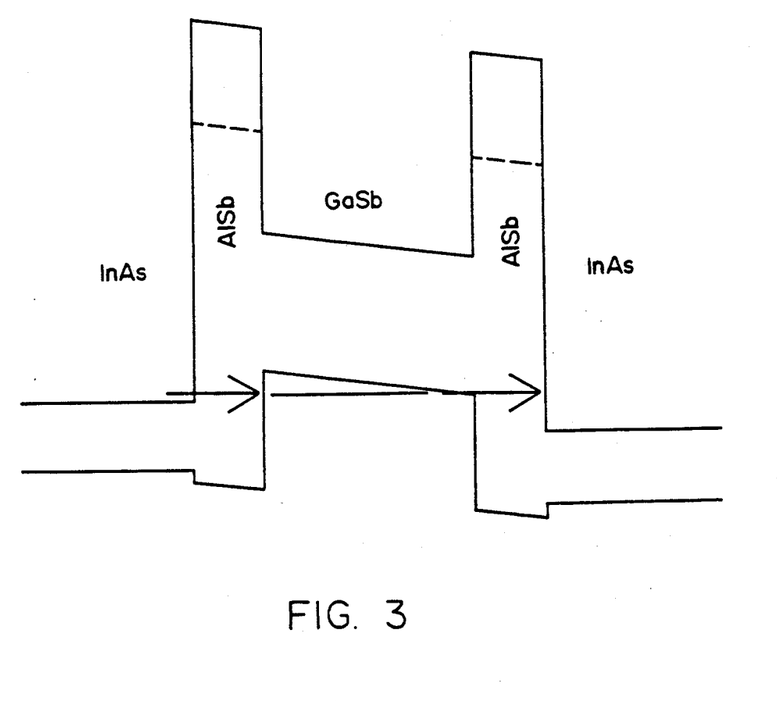
FIG. 3 illustrates the band diagram of FIG. 1, but after a selected bias voltage has been applied to the heterostructure to create the resonant effect previously described.
Figure 4:
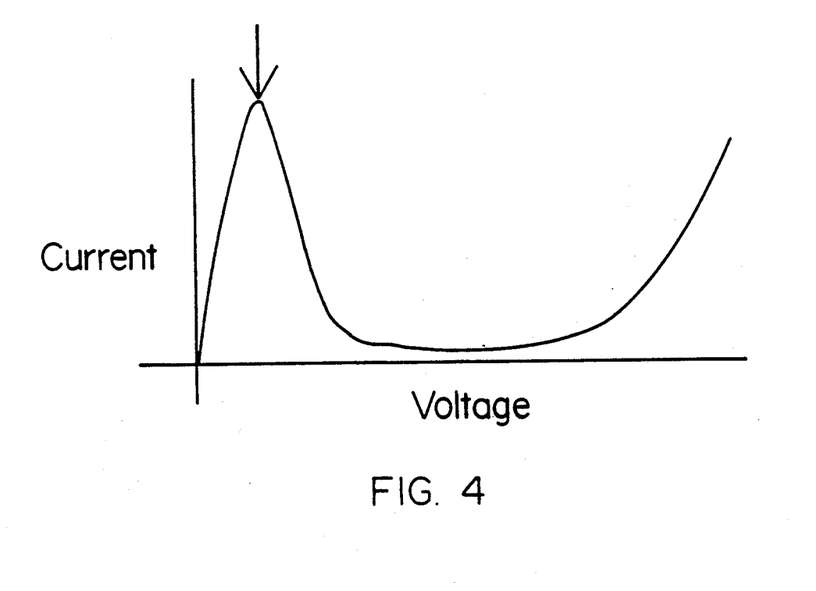
FIG. 4 is a graphical representation equivalent to that of FIG. 2, but illustrating the point on the current-voltage characteristic corresponding to the band diagram of FIG. 3
Figure 5:
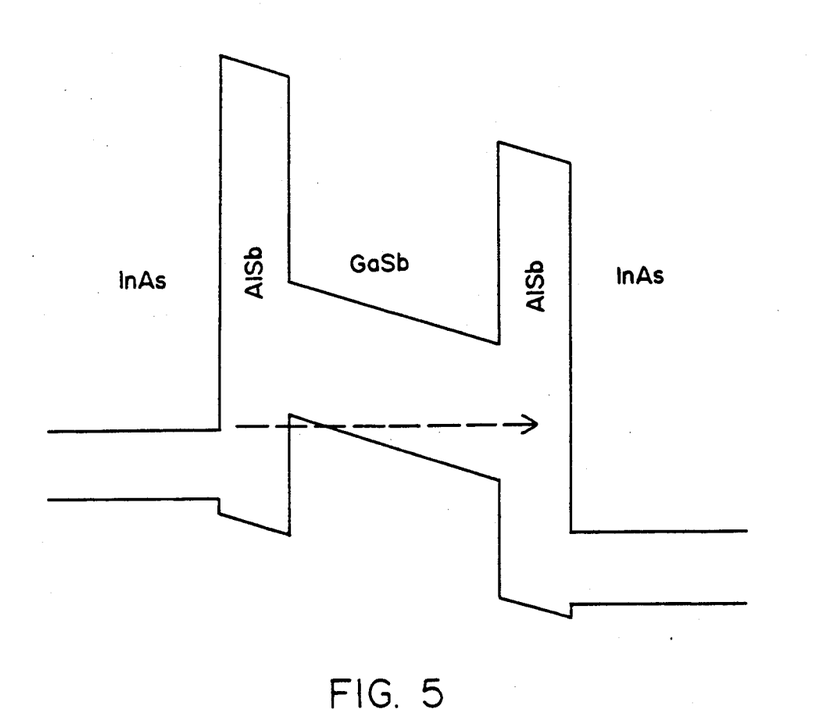
FIG. 5 is a band diagram of the same heterostructure as that illustrated in FIG. 1, but illustrating the effect thereon of a bias voltage greater than the resonant voltage wherein tunneling is blocked.
Figure 6:
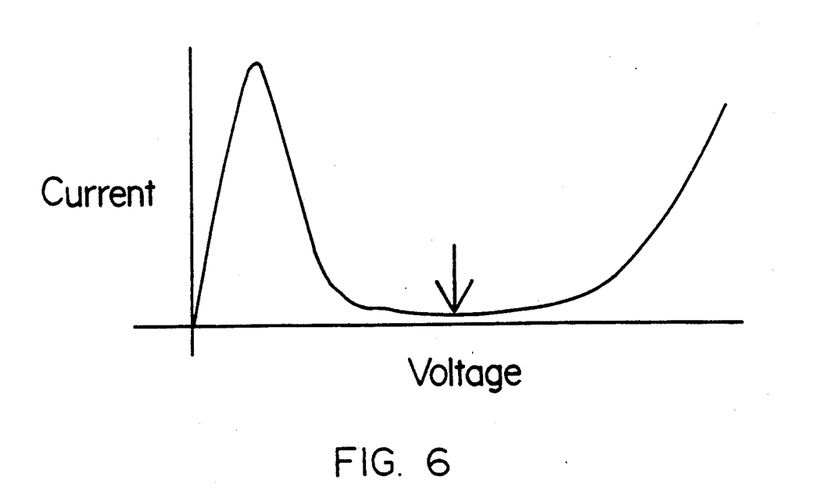
FIG. 6 is a current-voltage characteristic of the heterostructure of FIG. 1, but illustrating the point thereon corresponding to the band diagram of FIG. 5.

The maximum current is obtained at a bias voltage where the maximum number of electrons can participate in the tunneling through the quantum state. In a double barrier resonant tunneling heterostructure this occurs when the quantized state is lined up in energy with the conduction band of the contact layer. However for the resonant interband tunneling heterostructure of the present invention, a more complicated situation exists because the energy bands in the direction parallel to the surface are pointing in opposite directions (i.e., up for indium arsenide conduction band and down for gallium antimonide valence band quantum well). Consequently, there is an overlap of bands at zero bias which, as pointed out in FIG. 2, is the biasing configuration for the energy band diagram of FIG. 1. The maximum number of tunneling electrons occur somewhere between zero bias and the point where the quantized state drops below the indium arsenide band edge. At higher voltages, electrons cannot tunnel through the quantized state due to energy conservation and consequently, the current is lower thereby producing a negative differential resistance. The resonant interband tunneling structure is similar to the double barrier resonant tunneling structure in that the peak current is caused by tunneling through the quantum state. However, the size of the total barrier experienced by tunneling electrons in the double barrier resonant tunneling structure decreases as voltage is applied. The electrons in the resonant interband tunneling structure on the other hand have to tunnel not only through the band gap of the aluminum antimonide layers, but also through the band gap of the gallium antimonide layer at voltages past resonance. Thus, the electrons experience a very thick barrier virtually eliminating valley current contributions arising from tunneling. These phenomena are represented in FIGS. 3-6. More specifically, FIG. 3 represents the energy band diagram at the voltage bias which produces resonance, (and thus current). This is where the maximum number of electrons participate in the tunneling through the quantum state. This maximum current state is the point in the current-voltage characteristic corresponding to the arrow indicated point shown in FIG. 4. FIG. 5 represents the energy band diagram at higher voltages where electron tunneling through the quantum state is impossible because the electrons have to tunnel not only through the band gap of the aluminum antimonide layers, but also through the band ga of the gallium antimonide layer, thereby virtually eliminating valley current contributions arising from tunneling. This point corresponds to the low current state shown in FIG. 6 at the point of the arrow.

Three samples have been studied, all displaying strong negative differential resistance. Peak-to-valley current ratios as high as 20 at room temperature and 88 at 77 degrees KELVIN, respectively, have been measured. These are believed to be the highest values reported currently for any tunnel structure. The samples were grown on gallium arsenide (100) substrates in a Perkin-Elmer 430 molecular beam epitaxy (MBE) system. An arsenic-cracker and an antimony-cracker were used to produce dimers instead of tetramers in the molecular beams. Details of specific bulk growth parameters for indium arsenide and gallium antimonide can be found in the Proceedings of the Material Research Society, 1989 Spring meeting, San Diego in an article by the inventors hereof as well as D. H. Chow, published by the Material Research Society of Pittsburgh, PA in 1989. Due to the large lattice mis-match (7.2%) between the substrate and the epilayer, a thick buffer layer was grown. The buffer layer consisted of 2500 Angstroms of gallium arsenidegrown at 600 degrees C., a five period $In_{0.7}/Ga_{0.3}As/GaAs$ (two monolayers/two monolayers) superlattice grown at 500 degrees C. to 520 degrees C. and a 1.0 micrometer layer of indium arsenide (heavily silicon doped) grown at 500 degrees C. The superlattice at the gallium arsenide/indium arsenide interface reduces the number of strain-induced dislocations which penetrate into the indium arsenide layer. This buffering scheme has previously been used for double barrier structures, single barrier structures and infrared superlattices with very good results.

The resonant interband tunneling structures were grown at 500 degrees C. on top of the buffer layer and consisted of a gallium antimonide quantum well sandwiched between aluminum antimonide barriers, 100 Angstrom undoped indium arsenide spacer layers and 500 Angstrom lightly doped ($n=2*10^{16} cm^{-3}$) indium arsenide spacer layers. The 2-step spacer layer technique is used to reduce the number of silicon donors in the barrier region and has previously been used for aluminum gallium arsenide/gallium arsenide double barrier structures. Finally, a 2500 Angstrom thick heavily doped ($n=2*10^{18} cm^{-3}$) indium arsenide cap layer was grown. The three samples had the following thickness for the aluminum antimonide, gallium antimonide, aluminum antimonide layers: sample A:25 Angstroms/65 Angstroms/25 Angstroms; sample B:25 Angstroms/65 Angstroms/15 Angstroms; sample C:25 Angstroms/100 Angstroms/15 Angstrom (the thinner barrier being closest to the substrate).

Mesa structures (area 100 micrometer squared) with gold/germanium contacts on top, were prepared using standard photolithography, lift-off and chemical etch techniques. Gold/germanium deposited on the etched indium arsenide buffer layer served as a "back" contact. No annealing was necessary since gold/germanium forms an ohmic contact to indium arsenide. The mesas were probed with a thin gold wire to establish electrical contact to the devices.

Figure 7:
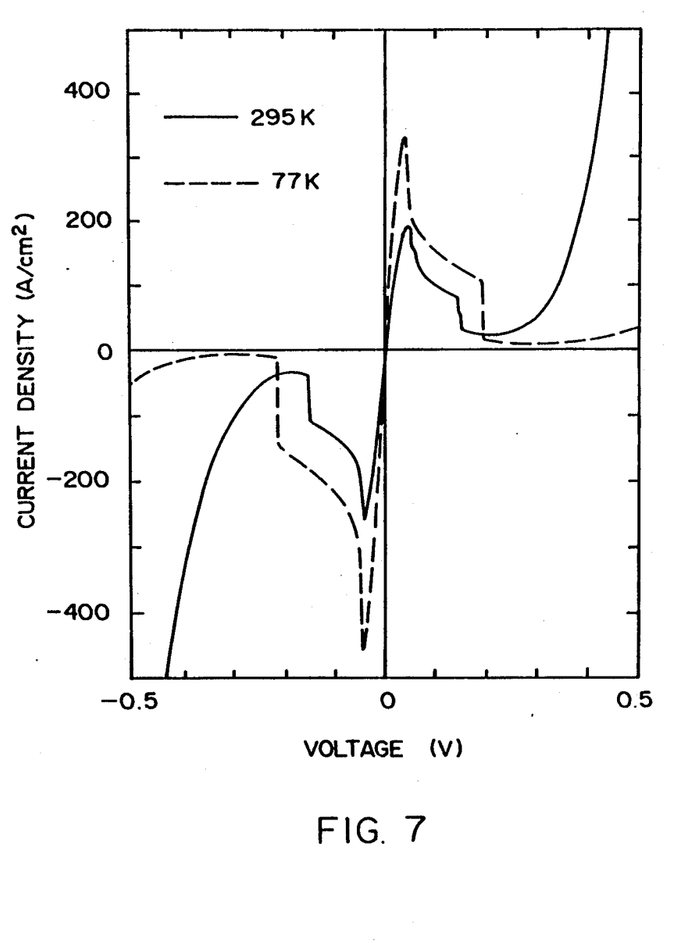
FIGS. 7-9 are graphical representations of current-voltage characteristics of three samples of the preferred embodiment actually reduced to practice.

The current-voltage (I-V) characteristic of sample A is shown in FIG. 7. A current peak corresponding to tunneling through the valence band quantized hole state can be seen for both forward and reverse bias. There is no threshold voltage for drawing current from the structure due to the fact that the bands overlap at zero bias as previously described. The peak-to-valley current ratios for this particular sample are 9.5 at room temperature and as high as 65 at 77 degrees KELVIN.

Figure 8:
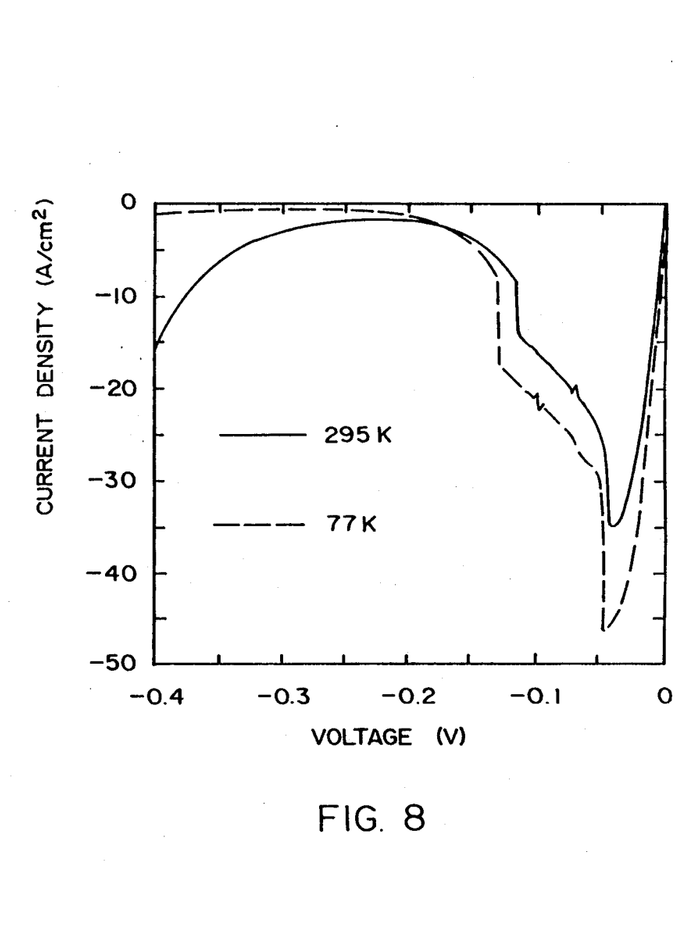
Figure 9:
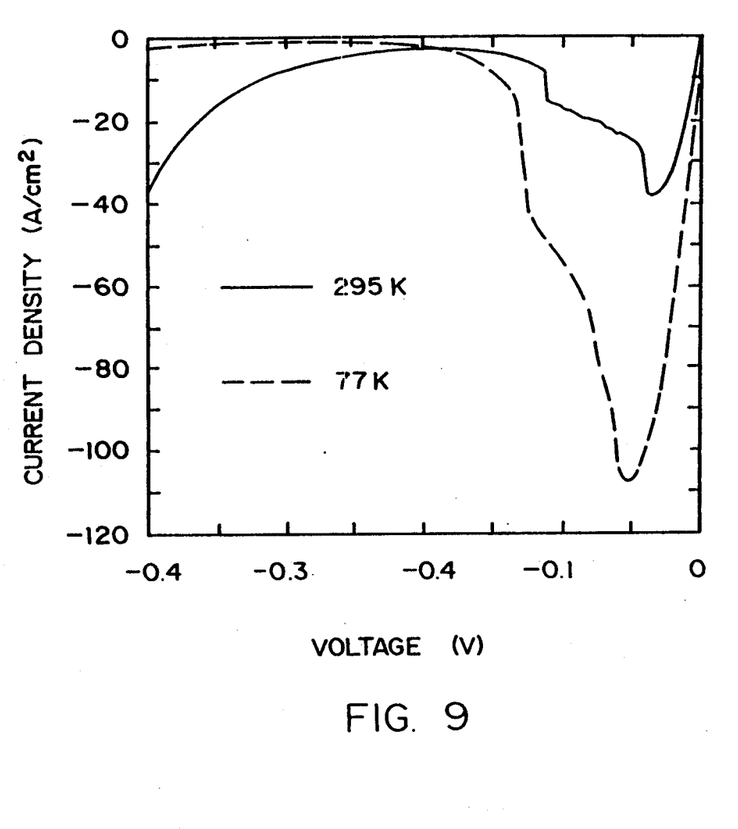
Figure 10:
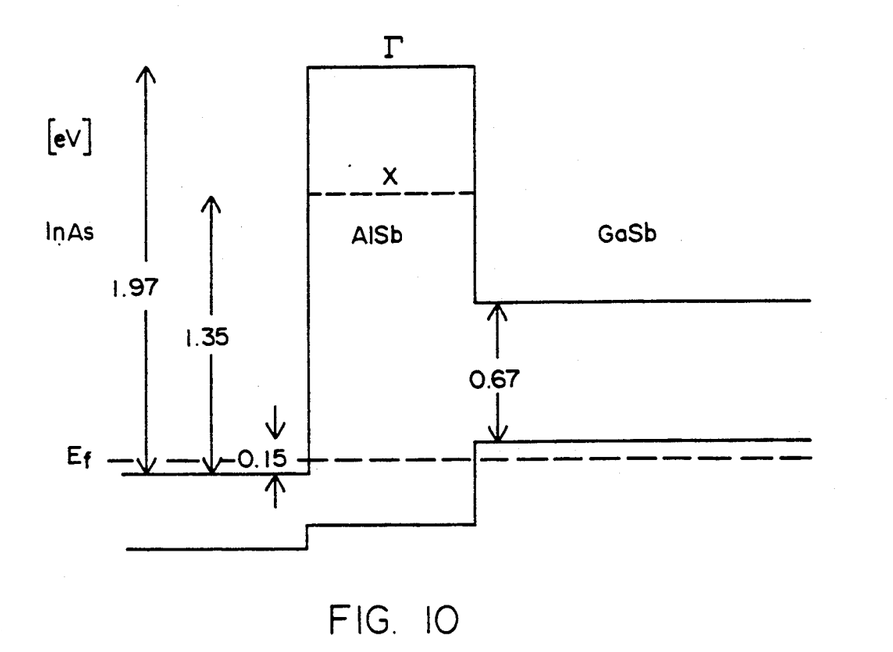
FIG. 10 is a alternative heterostructure for negative differential resistance with only three different layers, but still based on the principle of interband tunneling. In this case the carriers in the InAs layers are electrons and the carriers in the GaSb layer are holes.
Figure 11:
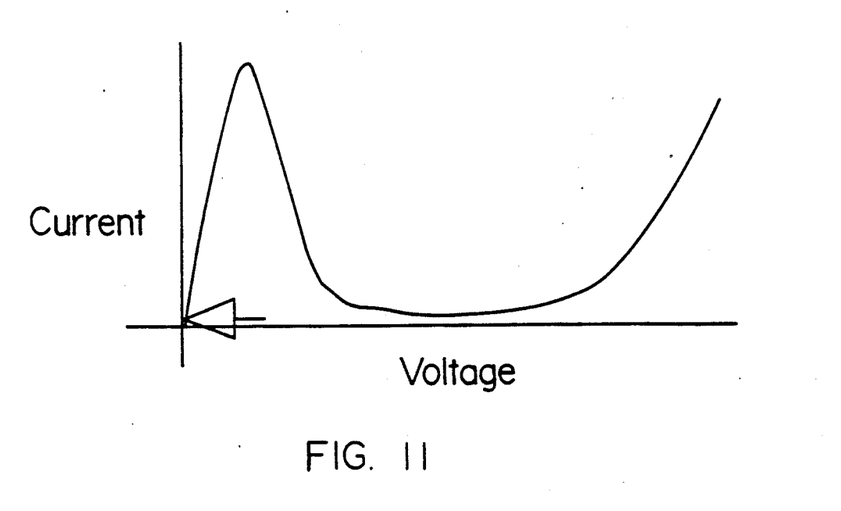
FIG. 11 is a current-voltage characteristic of the three layer heterostructure of FIG. 10 shown in its unbiased configuration with the bias voltage at zero.
Figure 12:
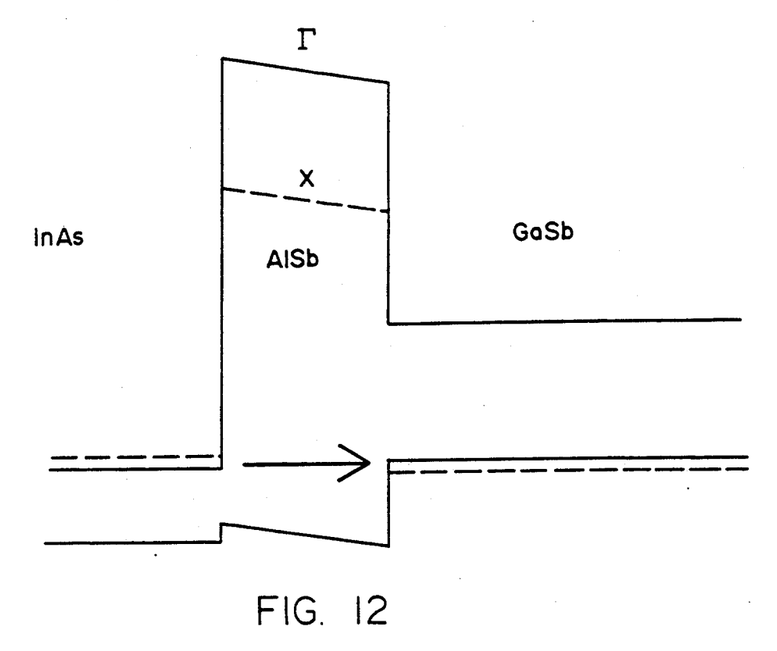
FIG. 12 is a band diagram similar to that of FIG. 10, but showing the three layer heterostructure of FIG. 12 in its resonant state.
Figure 13:
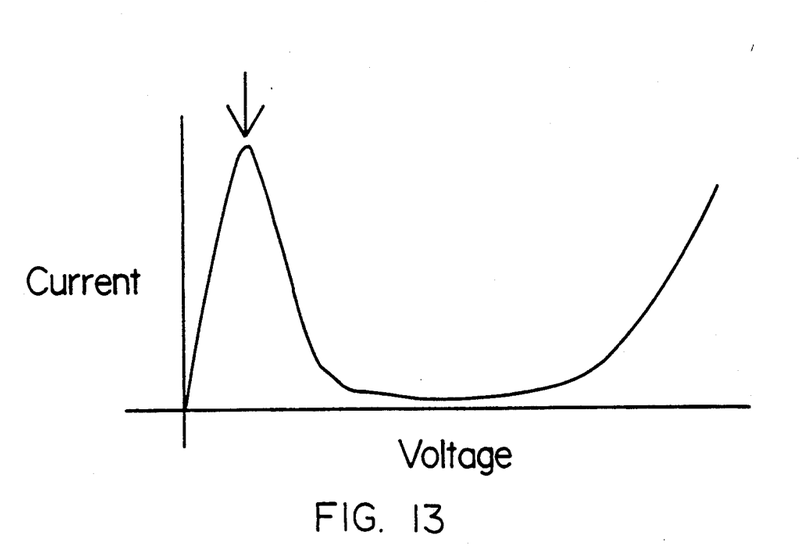
FIG. 13 is a current-voltage characteristic of the three layer heterostructure of FIG. 22 in its resonant state.
Figure 14:
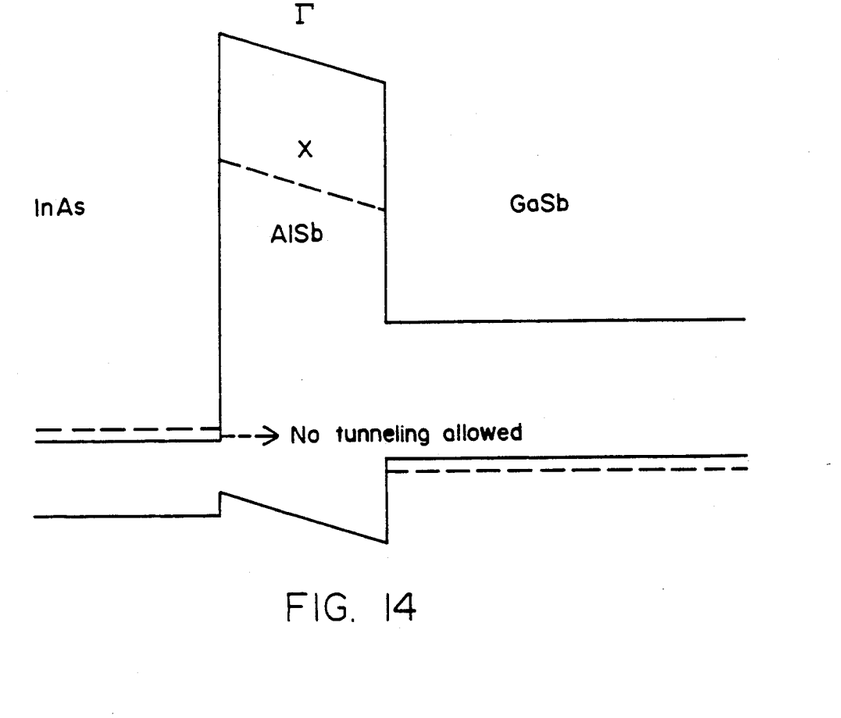
FIG. 14 is a band diagram similar to that of FIGS. 10 and 12, but showing the three layer heterostructure thereof in its barrier configuration.
Figure 15:
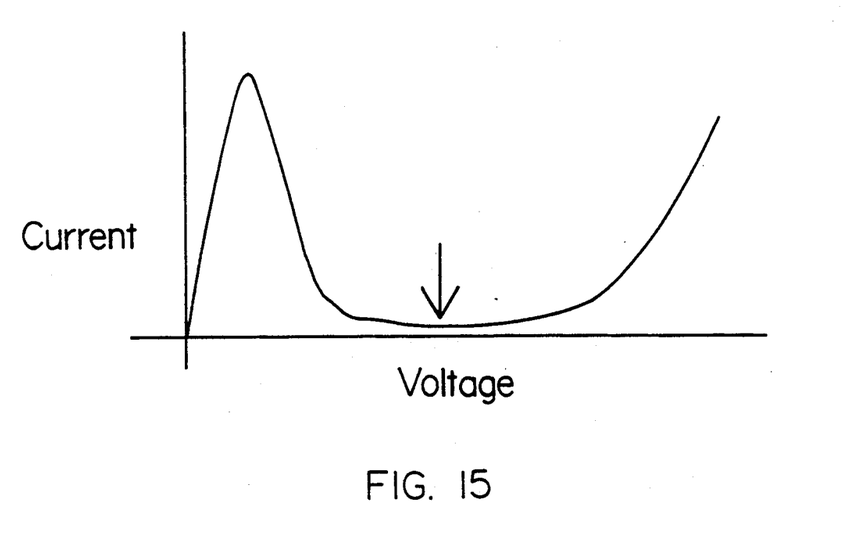
FIG. 15 is a current-voltage characteristic illustrating the biasing configuration of the heterostructure of FIG. 14.

Samples B and C were both grown intentionally asymmetric with the thinnest barrier closest to the substrate. In these samples the peak currents in the forward direction (mesa contact positive relative to substrate) were about six times larger than for reverse bias. Thus, the largest current is obtained with electrons tunneling through the thinner barrier into the quantum well and out through the thicker barrier. The peak-to-valley current ratios at forward bias for these two samples were about 9 at room temperature and 28 at 77 degrees KELVIN. The best peak-to-valley current ratios, however, were obtained for reverse bias and these current-voltage characteristic curves can be seen in FIGS. 8 and 9. Sample B (65 Angstrom well) displayed a room temperature peak-to-valley current ratio as high as 20. Sample C (100 Angstrom well) had the best peak-to-valley current ratio at 77 degrees KELVIN of all the samples with a very large value of 88. This value is much larger than any previously reported for tunnel structures.

One important feature in all the current-voltage curves is that the low valley current extends to relatively high voltages. It is believed that this is due to the band gap of the gallium antimonide being pushed down to the energy of the tunneling electrons as previously described. Thus the electrons experience a very thick barrier which keeps the current low even at higher voltages.

In all three samples the currents at 77 KELVIN are larger than at room temperature. This is most obvious in Sample C. It is believed that this may be caused by reduced thermal spreading of the carriers which would allow more states to participate in the tunneling or possibly, variations of band gaps with temperature.

The results derived from the three fabricated samples illustrate that the resonant interband tunneling diode is a promising alternative for future applications of negative differential resistance devices with very high peak-to-valley current ratios and a wide low current valley region. The best peak current density is presently about 600 Amperes per square centimeter, but is expected to increase as the device structure is optimized.

In theory, the unusually high peak-to-valley current ratios achieved with the aforementioned heterostructure which produces the band diagram of FIG. 1, should be substantially identical t the performance achieved omitting the second layers of aluminum antimonide and indium arsenide. Consequently, FIGS. 10–15 illustrate band diagrams and corresponding current-voltage characteristics for such a three layer heterostructure and indicate substantially identical results obtained therefrom. In this case as well, the gallium antimonide layer for voltages near and at resonance allows current to flow through it while at higher voltages, the gallium antimonide layer acts as a barrier yielding a lower current because of the prevention of tunneling.

Figure 17:
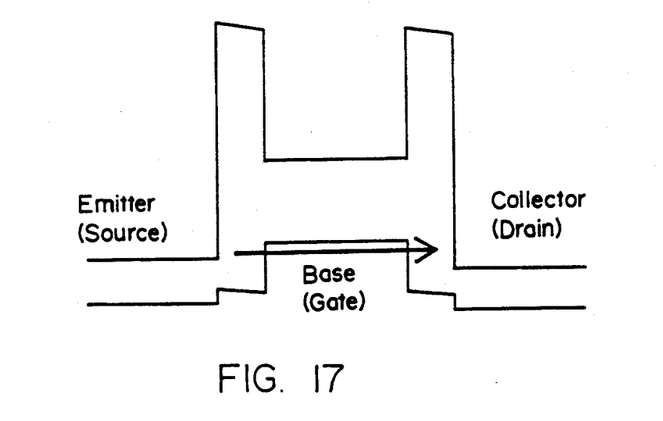
FIG. 17 is a band diagram illustrating the tunneling configuration of the transistor configuration of FIG. 16.
Figure 18:
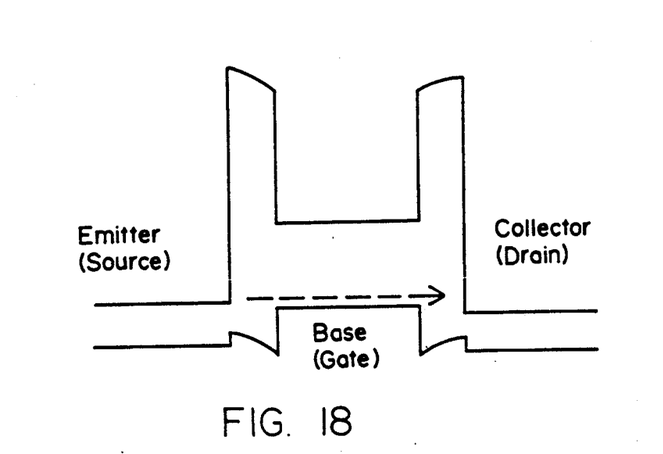
FIG. 18 is a band diagram illustrating the barrier configuration of the transistor embodiment of FIG. 16.
Figure 20:
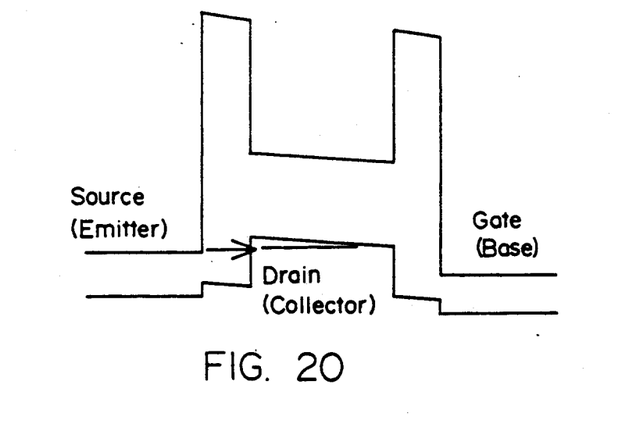
FIG. 20 is a band diagram illustrating the tunneling characteristic of the transistor configuration of FIG. 19.
Figure 21:
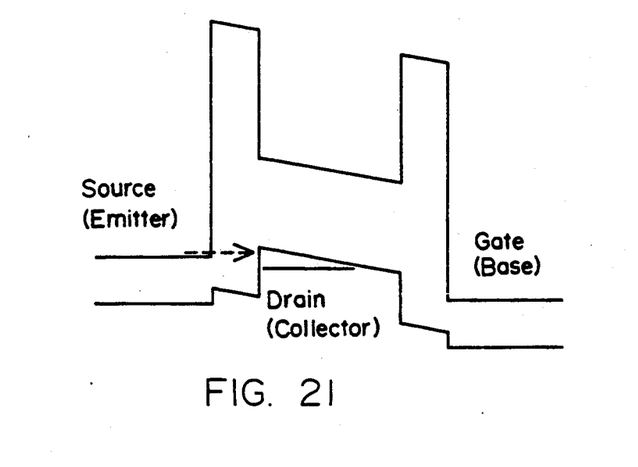
FIG. 21 is a band diagram illustrating the barrier configuration of the transistor of FIG. 19.

The novel structure of the present invention can also be used for three terminal negative differential resistance devices. Two such devices are illustrated herein in FIGS. 16 and 19, respectively, with FIGS. 17 and 18 showing the band diagrams for peak current and valley current, respectively of one such configuration and FIGS. 20 and 21 showing the corresponding band diagrams for the other configuration of transistor embodiment.

Figure 16:
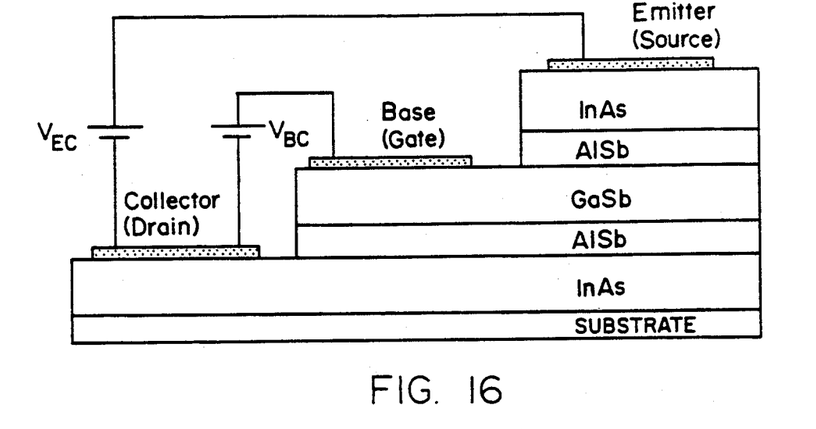
FIG. 16 is a first transistor embodiment of the present invention.

More specifically, as shown in FIG. 16, the resonant interband tunneling device of the present invention may be configured as a transistor with the gallium antimonide layer providing the base or gate junction and the indium arsenide layers providing the emitter or source junction in one case and the collector or drain junction in the other. In this configuration, at some relatively low base-to-collector voltage and at a given emitter-to-collector voltage, a large current will flow to the collector and the transistor will be in its ON state corresponding to the band diagram of FIG. 17. However, at a higher positive base-to-collector voltage and the same given emitter-to-collector voltage of the ON state, the valence band edge of the quantum well layer is now pushed down below the energy of the electrons in the emitter or source junction and the transistor will be in its OFF state with virtually zero current flowing from emitter-to-collector or source-to-drain corresponding to the band diagram of FIG. 18.

Figure 19:
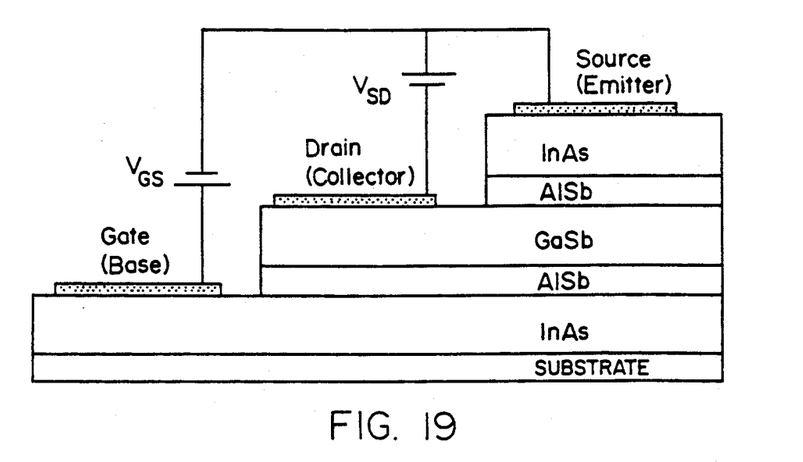
FIG. 19 is a second transistor embodiment of the present invention.

FIG. 19 illustrates a transistor based on the resonant interband tunneling structure of the present invention with the gallium antimonide layer serving as the drain or collector junction of the transistor. In this configuration, at a relatively low gate-to-source voltage and at a given source-to-drain voltage, a large current flows to the quantum well drain or collector and the transistor is in its ON state corresponding to the band diagram illustrated in FIG. 20. On the other hand, at a higher gate-to-source voltage and at the same source-to-drain voltage, the valence band quantum well is made more skewed, pushing the quantized state below the energy of the source or emitter electrons and eliminating all tunneling currents to the drain or collector. In this configuration the transistor is in its OFF state corresponding to the band diagram of FIG. 21.

It will now be understood that what has been disclosed herein comprises a novel combination of semiconductor heterojunctions which yield a quantum-effect device with resonant or enhanced transmission of electrons or holes due to tunneling into a quantum well state in the valence or conduction band. A particular heterostructure comprising sequentially grown layers of indium arsenide, aluminum antimonide, gallium antimonide, aluminum antimonide and indium arsenide, permits electrons tunneling from the indium arsenide conduction band through the aluminum antimonide barrier into a sub-band level in the valence band quantum well of the gallium antimonide. This particular embodiment produced a current-voltage characteristic with negative differential resistance and a peak-to-valley current ratio of about 20 at room temperature and 88 at liquid nitrogen temperature. These peak-to-valley current ratios are believed to be current world records for any tunnel structure. The most significant feature of the present invention is the combination of a novel electronic structure of a particular heterostructure to produce a very substantial negative differential resistance. Such large negative differential resistance devices can find useful applications in high frequency microwave devices and high speed digital electronic devices. The novel tunnel device of the present invention described herein can be used either as a two-contact device such as a diode or a three-contact device such as a transistor.

Any combination of materials which have the required band alignments can be used for this device. The important feature of the bands is that the conduction band edge of the contact layers are lower in energy than the valence band edge of the quantum well layer. In the present state of development only the InAs/AlSb/GaSb/AlSb/InAs heterostructure shown in FIG. 1 has been considered. The electrons tunnel from the conduction band of the InAs layer through the AlSb barrier layer into the quantized state in the GaSb valence band quantum well. At a voltage where the quantized state and the conduction band of the contact layer are lined up in energy (as shown in FIG. 2) the number of tunneling electrons will be at a maximum yielding a large current. At higher voltages the quantized state will be lower in energy than the tunneling electrons and the current will be smaller. This results in a current-voltage curve with negative differential resistance. The difference between this device and the conventional resonant tunneling diode is that the quantum well state is located in the valence band of the quantum well layer. This has the advantage that for voltages above the resonance voltage, the tunneling electrons will experience a very rigid barrier because they have to tunnel through the band gap of both the barrier layers and the quantum well layer. This yields a very low valley current.

Those having skill in the art to which the present invention pertains will now, as a result of the applicants' teaching herein, perceive various modifications and additions which may be made to the invention. Thus for example, while a specific heterostructure has been disclosed herein it will be understood that any combination of materials which have the required band alignments can be used for this device. The device of the present invention can alternatively be constructed with a material combination in which the valence band edge of the contact layers are higher in energy than the conduction band of the quantum well layer. In this case the carriers are holes tunneling from the valence band of the contact layer to the conduction band of the quantum well layer. This could for example be achieved in a GaSb/AlSb/InAs/AlSb/GaSb heterostructure in which the GaSb layers are p-doped. Other possible material combinations for resonant interband tunneling and heterostructure interband tunneling structures include indium arsenide and gallium antimonide without the aluminum antimonide barrier layer; indium antimonide, cadmium tuluride and tin as well as indium arsenide, zinc tuluride and gallium antimonide. Other material combinations may also be possible as epitaxial growth techniques improve. Accordingly, all such modifications and additions are deemed to be within the scope of the invention which is to be limited only by the claims appended hereto.

We claim:

1. A tunneling electronic semiconductor device comprising:
 a series of abutting material layers, the electron energy levels of which provide a quantum well layer between adjacent layers, the valence electron energy level of said quantum well layer being higher than the conduction electron energy level of said adjacent layer at a first selected bias voltage across said series of layers and the valence electron energy level of said quantum well layer being lower than the conduction electron energy level of said adjacent layers at a second selected bias voltage across said series of layers, whereby maximum tunneling current flows through said device during application of said first bias voltage and minimum tunneling current flows through said device during application of said second bias voltage.

2. The device recited in claim 1 wherein said series of material layers comprises InAs/AlSb/GaSb/AlSb/InAs.

3. The device recited in claim 1 wherein said device is a diode.

4. The device recited in claim 1 wherein said device is a transistor.

5. The device recited in claim 1 wherein the ratio of said maximum current to said minimum current is at least about 20 at room temperature and is at least about 88 at 77 degrees KELVIN.

6. A resonant interband tunneling electronic device comprising:
   a quantum well layer;
   a pair of barrier layers sandwiching said quantum well layer; and
   a pair of contact layers sandwiching said barrier layers and said well layer;
   the valence energy level of said well layer being higher than the conduction energy level of said contact layers at a first selected bias voltage across said device and the valence energy level of said well layer being lower than the conduction energy level of said contact layers at a second selected bias voltage across said device;
   whereby maximum tunneling current flows through said device during application of said first bias voltage and minimum tunneling current flows through said device during application of said second bias voltage.

7. The device recited in claim 6 wherein said quantum well layer comprises GaSb.

8. The device recited in claim 6 wherein said barrier layers comprise AlSb.

9. The device recited in claim 6 wherein said contact layers comprise InAs.

10. A heterostructure interband tunneling electronic device comprising:
    a quantum well layer;
    a barrier layer; and
    a contact layer;
    the valence energy level of said well layer being selectively adjustable to be higher and lower than the conduction energy level of said contact layer depending upon the bias voltage across said device;
    whereby maximum tunneling current flows through said device during application of a first bias voltage to raise said valance energy level above said conduction energy level and minimum tunneling current flows through said device during application of a second bias voltage to lower said valance energy level below said conduction energy level.

11. The device recited in claim 10 wherein said quantum well layer comprises GaSb.

12. The device recited in claim 10 wherein said barrier layer comprises AlSb.

13. The device recited in claim 10 wherein said contact layer comprises InAs.

14. The device recited in claim 10 further comprising a substrate of GaAs.

15. A quantum-effect transistor comprising:
    a epitaxially-grown series of material layers on a underlying substrate;
    said layers having a quantum well layer sandwiched between two barrier layers which are in turn, sandwiched between two contact layers;
    said well layer having a valence energy level which can be made selectively higher and lower than the conduction energy level of said contact layer depending upon the magnitude of a bias voltage established between said well layer and a contact layer;
    whereby maximum tunneling current flows through said transistor during application of a first bias voltage to raise said valence energy level above said conduction energy level and minimum tunneling current flows through said transistor during application of a second bias voltage to lower said valance energy level below said conduction energy level.

16. The transistor recited in claim 15 wherein said quantum well layer comprises GaSb.

17. The transistor recited in claim 15 wherein said barrier layers comprise AlSb.

18. The transistor recited in claim 15 wherein said contact layers comprise InAs.

19. The transistor recited in claim 15 wherein said well layer is the base of said transistor.

20. The transistor recited in claim 15 wherein said well layer is the collector of said transistor.

21. A quantum-effect electronic device of the type in which current flow is determined by the number of tunneling hole carriers, the device comprising:
    a quantum well layer of material;
    a barrier layer of material; and
    a contact layer of material;
    the valence energy band edge of the contact layer being selectively made higher and lower than the conduction energy band edge of the well layer depending upon the bias voltage magnitude applied across said layers;
    whereby maximum tunneling current flows through said device during application of a first bias voltage to raise said valance energy level above said conduction energy level and minimum tunneling current flows through said device during application of a second bias voltage to lower said valance energy level below said conduction energy level.

* * * * *